(12) United States Patent
Kim

(10) Patent No.: US 12,110,608 B2
(45) Date of Patent: Oct. 8, 2024

(54) APPARATUS OF OXIDATION-COMBUSTING AN INGOT GROWER AND METHOD THEREOF

(71) Applicant: SK SILTRON CO., LTD., Gumi-si (KR)

(72) Inventor: Jung Ryul Kim, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 719 days.

(21) Appl. No.: 17/235,809

(22) Filed: Apr. 20, 2021

(65) Prior Publication Data

US 2022/0235485 A1    Jul. 28, 2022

(30) Foreign Application Priority Data

Jan. 26, 2021    (KR) .................. 10-2021-0010820

(51) Int. Cl.
| | |
|---|---|
| *C30B 15/04* | (2006.01) |
| *B01D 46/44* | (2006.01) |
| *B01D 46/48* | (2006.01) |
| *B08B 7/00* | (2006.01) |
| *C30B 15/00* | (2006.01) |

(52) U.S. Cl.
CPC ............ *C30B 15/04* (2013.01); *B01D 46/448* (2013.01); *B01D 46/48* (2013.01); *B08B 7/0007* (2013.01); *C30B 15/00* (2013.01); *B01D 2273/10* (2013.01); *B01D 2273/30* (2013.01); *B01D 2279/35* (2013.01)

(58) Field of Classification Search
CPC ....... C30B 15/04; C30B 15/00; B01D 46/448; B01D 46/48; B01D 2273/10; B01D 2273/30; B01D 2279/35; B08B 7/0007

USPC .......................................................... 431/18
See application file for complete search history.

(56) References Cited

U.S. PATENT DOCUMENTS

| | | | |
|---|---|---|---|
| 2003/0200867 A1* | 10/2003 | Becker | B01D 46/4272 95/273 |
| 2017/0314162 A1 | 11/2017 | Okita | |
| 2020/0346258 A1* | 11/2020 | Maegawa | B08B 9/035 |

FOREIGN PATENT DOCUMENTS

| | | |
|---|---|---|
| CN | 206956213 U | 2/2018 |
| CN | 207944166 U | 10/2018 |
| JP | H07-58018 A | 3/1995 |
| JP | 2012-144379 A | 8/2012 |
| JP | 2019-108257 A | 7/2019 |
| KR | 20110026702 A | 3/2011 |
| KR | 20110090500 A | 8/2011 |
| KR | 10 2013-0023241 A | 3/2013 |
| KR | 20150081698 A | 7/2015 |

(Continued)

OTHER PUBLICATIONS

Office Action for Chinese Application No. 202110457385.4 dated Mar. 29, 2023, 8 pages.

(Continued)

*Primary Examiner* — Vivek K Shirsat
(74) *Attorney, Agent, or Firm* — Lewis Roca Rothgerber Christie LLP

(57) ABSTRACT

A method of oxidation-combusting an ingot grower comprises a) blocking between the filter housing and the exhaust pipe, b) forming the filter housing in a vacuum state, and c) injecting air into the filter housing through an injection pipe connected to a first side of the filter housing to combust the filter housing.

13 Claims, 5 Drawing Sheets

(56) References Cited

FOREIGN PATENT DOCUMENTS

KR  10-2015-0111636 A  10/2015
KR  10-1567663 B1  11/2015
KR  10-2020-0095520 A  8/2020

OTHER PUBLICATIONS

Office Action for Korean Application No. 10-2021-0010820 dated Mar. 21, 2023, 2 pages.

* cited by examiner

| Period | First valve (191) | Second valve (192) | Third valve (193) | Fourth valve (194) | Fifth valve (195) |
|---|---|---|---|---|---|
| T1 | ON | ON | OFF | OFF | OFF |
| T2 | OFF | OFF | OFF | OFF | ON |
| T3 | OFF | ON | OFF | OFF | OFF |
| T4 | OFF | OFF | OFF | OFF | OFF |
| T5 | OFF | OFF | ON | OFF | OFF |
| T6 | OFF | OFF | ON | ON | OFF |

APPARATUS OF OXIDATION-COMBUSTING AN INGOT GROWER AND METHOD THEREOF

CROSS-REFERENCE TO RELATED APPLICATION(S)

This application claims priority to Korean Patent Application Number 10-2021-0010820, filed on Jan. 26, 2021, the entire content of which is incorporated herein by reference.

BACKGROUND

The embodiment relates to an apparatus of oxidation-combusting an ingot grower and method thereof.

In order to mass-produce most of the semiconductor chips or solar cells used in electronic products, a wafer is generally used as a substrate.

Such a wafer is mainly made by growing a single crystal ingot from a seed and then slicing it into a thin thickness, and the single crystal ingot can be manufactured by the Czochralski method (CZ method).

In the Czochralski method, silicon is placed in a quartz crucible in a chamber, the quartz crucible is heated to melt the silicon, and then the seed crystal is brought into contact with the silicon melt while rotating and gradually pulling up the seed from the surface of the single crystal. This is a method of growing an ingot having a predetermined diameter by solidifying the melt into a solid.

On the other hand, when growing a single crystal for manufacturing a low-resistance wafer for a power device, red phosphorus as an N-type dopant is doped on the wafer.

The volatilization point of red phosphorus is lower than the melting point of silicon constituting the wafer and volatilizes during single crystal growth, which is deposited on the inner surface of the chamber inner wall, exhaust pipe, filter housing, etc. to form deposits.

When such deposits react rapidly with oxygen and at the same time as friction during the final cleaning process, there is a risk of explosion, and thus a combustion process is performed through an oxidation reaction to remove them in a chemically safe state.

In the combustion process through oxidation reaction, the high-temperature deposits are exposed to the atmosphere, that is, external air, and combustion is performed through the oxidation reaction of air and deposits.

However, due to the ignition characteristics of red phosphorus, there is a problem in that dust explosion occurs during the combustion process, thereby exposing workers to danger. In addition, there is a risk of explosion due to friction in the subsequent cleaning process of deposits that are not combusted during the combustion process.

In addition, there is a problem in that the clay material generated during the combustion process passes through the filter housing and flows into the main pump, causing the main pump to be broken.

That is, when the deposits made of red phosphorus is exposed to the atmosphere, combustion occurs as shown in Chemical Formula 1 to produce oxides.

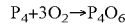  [Chemical Formula 1]

$$P_4 + 3O_2 \rightarrow P_4O_6$$

When the oxides generated by Chemical Formula 1 are exposed to moisture, a clay material is produced as shown in Chemical Formula 2.

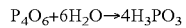  [Chemical Formula 2]

$$P_4O_6 + 6H_2O \rightarrow 4H_3PO_3$$

Since the clay material enters the main pump through the filter housing as a liquid, the main pump may be broken by the clay material.

SUMMARY

The embodiment aims to solve the above and other problems.

Another object of the embodiment is to provide an apparatus of oxidation-combusting an ingot grower and method thereof capable of completely removing deposits from a filter housing.

Another object of the embodiment is to provide an apparatus of oxidation-combusting an ingot grower and method thereof capable of easily removing deposits of a filter housing.

Another object of the embodiment is to provide an apparatus of oxidation-combusting an ingot grower and method thereof capable of preventing a failure of a main pump in advance.

According to an aspect of the embodiment to achieve the above or other objects, a method of oxidation-combusting an ingot grower comprising a chamber, an exhaust pipe connected to the chamber, and a filter housing connected to the exhaust pipe, the method comprising: a) blocking between the filter housing and the exhaust pipe; b) forming the filter housing in a vacuum state; and c) injecting air into the filter housing through an injection pipe connected to a first side of the filter housing to combust the filter housing.

According to another aspect of the embodiment, an apparatus of oxidation-combusting an ingot grower, the apparatus comprises: a chamber; an exhaust pipe connected to the chamber; a filter housing connected to the exhaust pipe; an injection pipe connected to a first side of the filter housing; and a controller, wherein the controller is configured to: block between the filter housing and the exhaust pipe and forming the filter housing in a vacuum state, and inject air into the filter housing through the injection pipe to combust the filter housing.

The effects of the apparatus of oxidation-combusting an ingot grower and method thereof according to the embodiment will be described as follows.

According to at least one of the embodiments, the filter housing is blocked from the exhaust pipe after single crystal growth, the filter housing is formed in a vacuum state, and the process of combusting the filter housing by injecting air is repeatedly performed, thereby completely removing deposits deposited on the filter housing. It has the advantage of being able to prevent failure of the main pump so that deposits do not flow into the main pump.

According to at least one of the embodiments, by injecting air into the chamber and the exhaust pipe by using a vacuum pump connected to the exhaust pipe after single crystal growth to combust the chamber and the exhaust pipe, it is possible to easily remove deposits deposited in the chamber and the exhaust pipe.

According to at least one of the embodiments, by forming the filter housing in a vacuum state, air is introduced into the filter housing at high speed, and the entire area of the filter housing is rapidly combusted so that deposits in the filter housing can be easily removed.

A further range of applicability of the embodiments will become apparent from the detailed description below. However, various changes and modifications within the spirit and scope of the embodiments may be clearly understood by those skilled in the art, and thus specific embodiments such as detailed description and preferred embodiments should be understood as being given by way of example only.

DETAILED DESCRIPTION OF THE EMBODIMENTS

Figure 1:
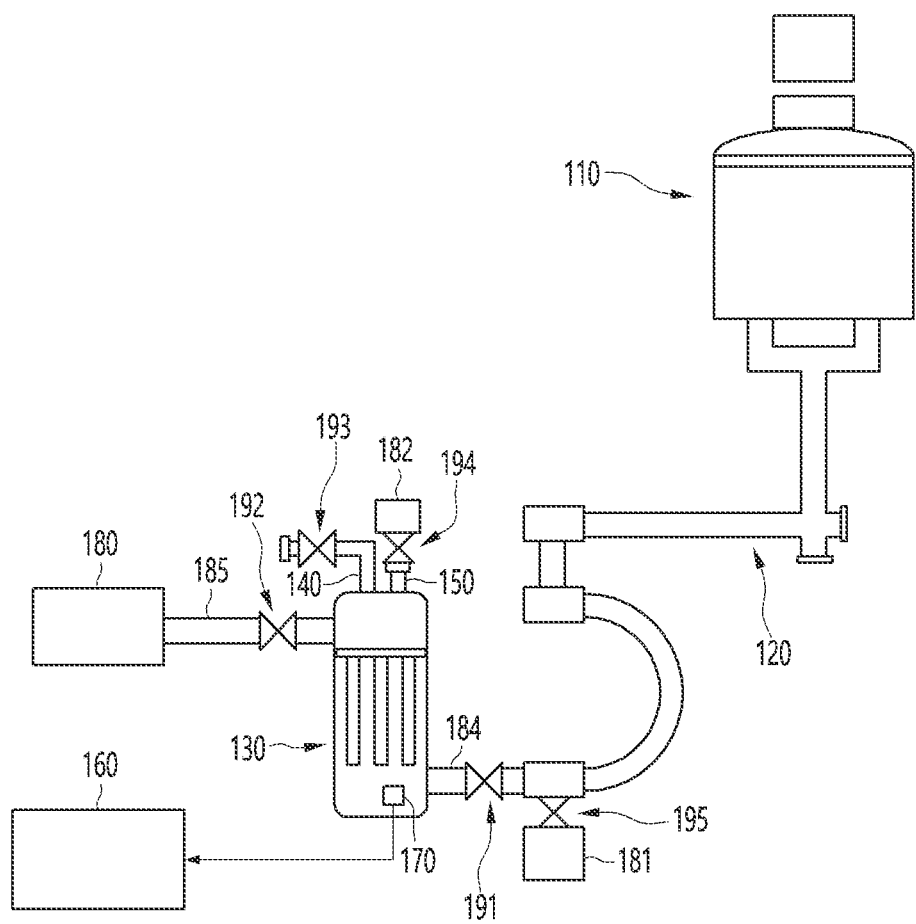
FIG. 1 is a view showing an apparatus of oxidation-combusting an ingot grower according to an embodiment.

Hereinafter, exemplary embodiments disclosed in the present specification will be described in detail with reference to the accompanying drawings, but identical or similar elements are denoted by the same reference numerals regardless of reference numerals, and redundant descriptions thereof will be omitted. The suffixes 'module' and 'unit' for constituent elements used in the following description are given or used interchangeably in consideration of the ease of preparation of the specification, and do not have themselves distinct meanings or roles. In addition, the accompanying drawings are for easy understanding of the embodiments disclosed in the present specification, and the technical spirit disclosed in the present specification is not limited by the accompanying drawings. Also, when an element such as a layer, region or substrate is referred to as being 'on' another elements, these include those that may exist directly on another element or may have other intermediate elements between them.

[Oxidation Combustion Apparatus]

FIG. 1 is a view showing an apparatus of oxidation-combusting an ingot grower according to an embodiment.

Referring to FIG. 1, the apparatus of oxidation-combusting the ingot grower according to the embodiment includes a chamber 110, an exhaust pipe 120, a filter housing 130, an injection pipe 140, a discharge pipe 150, and a controller 160. The apparatus of oxidation-combusting the ingot grower according to the embodiment may include more elements than these elements hereby, and elements not described below among the more elements can be easily understood from the prior art.

The chamber 110 is a member for growing a single crystal ingot which becomes a material for a wafer, which is a substrate of a semiconductor chip or a solar cell. During the growth of the single crystal ingot, the inside of the chamber 110 may be maintained in a vacuum state so that external foreign substances, etc. are not introduced into the single crystal ingot.

The chamber 110 may be connected to the main pump 180 through the exhaust pipe 120. Air in the chamber 110 may be discharged by driving the main pump 180 so that the interior of the chamber 110 may be maintained in a vacuum state. Although not shown, an air injection pipe may be connected to one side of the exhaust pipe 120. Air is introduced into the chamber 110 through the air injection pipe and the exhaust pipe 120 so that the vacuum inside the chamber 110 may be released. Accordingly, when the vacuum of the chamber 110 is formed, the main pump 180 is driven, and when the vacuum of the chamber 110 is released, air may be injected into the air injection tube.

The filter housing 130 is positioned between the main pump 180 and the exhaust pipe 120 to filter foreign substances supplied from the chamber 110 through the exhaust pipe 120.

The injection pipe 140 is connected to a first side of the filter housing 130 to inject air in the atmosphere into the filter housing 130. The discharge pipe 150 may connect the second vacuum pump 182 and a second side of the filter housing 130 to discharge air in the filter housing 130 to the outside. For example, a circulation structure through which air flows into the injection pipe 140, the filter housing 130, and the discharge pipe 150 is formed by the injection pipe 140, the filter housing 130, and the discharge pipe 150 so that a temperature of the filter housing 130 can be forcibly lowered.

Meanwhile, the apparatus of oxidation-combusting the ingot grower according to the embodiment may include a plurality of valves 191 to 195.

The filter housing 130 may be connected to the exhaust pipe 120 through the first connection pipe 184. For example, the first valve 191 may be installed in the first connection pipe 184 to connect or block the filter housing 130 and the exhaust period.

The main pump 180 may be connected to the filter housing 130 through the second connection pipe 185. For example, the second valve 192 may be installed in the second connection pipe 185 to connect or block the main pump 180 and the filter housing 130.

The third valve 193 may be installed in the injection pipe 140 to inject air in the atmosphere into the filter housing 130 or block it.

The fourth valve 194 may be installed in the discharge pipe 150 to discharge the air inside the filter housing 130 to the outside or block it.

The first vacuum pump 181 is installed on one side of the exhaust pipe 120 to discharge air introduced into the chamber 110 to the outside through the exhaust pipe 120.

The fifth valve 195 is installed between the exhaust pipe 120 and the first vacuum pump 181 to discharge the air of the exhaust pipe 120 to the outside or block it. Although not shown, the exhaust pipe 120 and the first vacuum pump 181 may be connected by a connection pipe, and a fifth valve 195 may be installed in the corresponding exhaust pipe 120.

Meanwhile, while the single crystal ingot is growing, a dopant such as red phosphorus is vaporized and deposited on the inner surfaces of the chamber 110, the exhaust pipe 120, and the filter housing 130 to form deposits. These deposits flow into the single crystal ingot and cause defects in the wafer produced from the single crystal ingot, and thus need to be removed.

The embodiment can be largely divided into a process of oxidizing combustion of the chamber 110 and the exhaust pipe 120 and a process of oxidizing combustion of the filter housing 130.

Figures 2, 3:
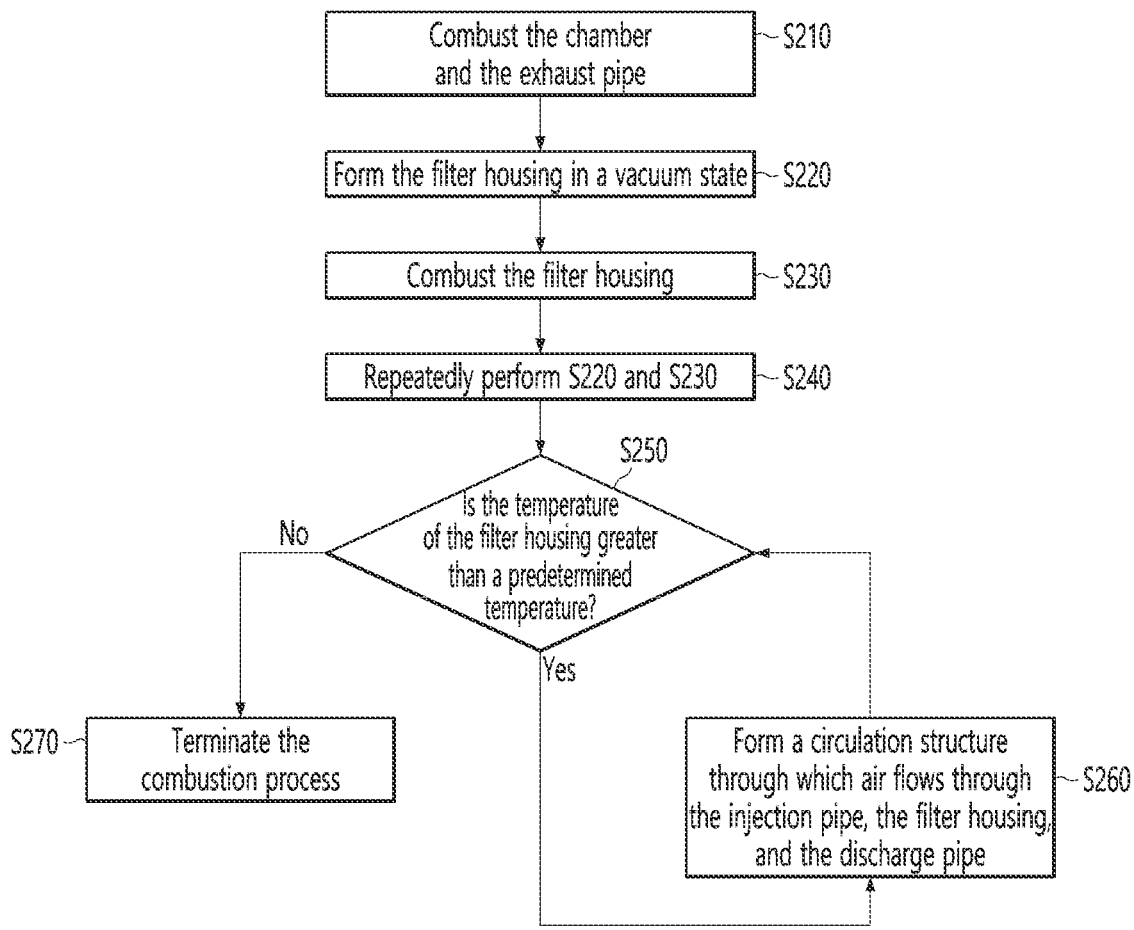
FIG. 2 is a flowchart illustrating a method of oxidation-combusting an ingot grower according to an embodiment.
FIG. 3 shows states of a plurality of valves for each period in the apparatus of oxidation-combusting the ingot grower of FIG. 1.

As shown in FIG. 3, the chamber 110 and the exhaust pipe 120 are oxidation-combusted during the second period T2, and the filter housing 130 can be oxidation-combusted during the third to sixth periods (T3 to T6).

In addition, a single crystal ingot may be grown in the chamber 110 in the first period T1.

Accordingly, after the single crystal ingot is grown in the first period T1, the chamber 110, the exhaust pipe 120, and the filter housing 130 may be oxidation-combusted during the second to sixth periods T2 to T6. That is, the first to sixth periods T1 to T6 constitute one cycle, and the chamber 110, the exhaust pipe 120, and the filter housing 130 may be oxidation-combusted every cycle, but this is not limited thereto. For example, the oxidation combustion process of the chamber 110, the exhaust pipe 120, and the filter housing 130 may be performed between the growth processes of each of the single crystal ingot.

According to the embodiment, after the chamber 110 and the exhaust pipe 120 are oxidation-combusted, the filter housing 130 is oxidation-combusted, but this is not limited thereto. For example, the filter housing 130 together with the chamber 110 and the exhaust pipe 120 may be oxidation-combusted at the same time, or after the filter housing 130 is oxidation-combusted, the chamber 110 and the exhaust pipe 120 may be oxidation-combusted.

The controller 160 may generally manage and/or control the ingot grower according to the embodiment. For example, the controller 160 may control the temperature and pressure of the chamber 110 and may control the vacuum state of the chamber 110.

For example, the controller 160 may oxidation-combust the chamber 110, the exhaust pipe 120, and the filter housing 130 by controlling the first to fifth valves 191 to 195. For example, the controller 160 may control a single crystal ingot to grow it in the chamber 110. For example, the controller 160 may control the chamber 110, the exhaust pipe 120, and the filter housing 130 to be oxidation-combusted in order to remove deposits produced by the growth of the single crystal ingot. Specifically, the controller 160 blocks between the filter housing 130 and the exhaust pipe 120, forms the filter housing 130 in a vacuum state, and injects air into the filter housing 130 through the injection pipe 140 to combust the filter housing 130. Air can be contained in the atmosphere.

Meanwhile, the apparatus of oxidation-combusting the ingot grower according to the embodiment may include at least one temperature sensor 170.

The temperature sensor 170 may be installed on one side of the filter housing 130 to measure the temperature of the filter housing 130. For example, the temperature sensor 170 may be installed at a point far from the injection pipe 140. Air in the atmosphere is injected into the filter housing 130 through the injection pipe 140 so that the deposits may be combusted by an oxidation reaction with the deposits of the filter housing 130. Combustion may be performed along the traveling direction of the air injected from the injection pipe 140. In the filter housing 130, a region adjacent to the injection pipe 140 may be combusted first, and a region far from the injection pipe 140 may be combusted later. When the combustion is complete, the deposits are removed and there are no more deposits to be combusted so that the temperature may decrease in the region of the filter housing 130 in which combustion is completed.

For example, when the injection pipe 140 is installed on the upper side of the filter housing 130, combustion may be performed first from the upper side of the filter housing 130 and then the combustion may proceed to the lower side of the filter housing 130. Accordingly, the temperature may be higher at the lower side of the filter housing 130 than at the upper side of the filter housing 130.

When the temperature measured from the lower side of the filter housing 130 is less than or equal to a predetermined temperature, it may be determined that combustion is completed not only at the upper side but also at the lower side of the filter housing 130. Accordingly, when the injection pipe 140 is installed on the upper side of the filter housing 130, the temperature sensor 170 may be installed on the lower side of the filter housing 130. For example, each of the at least one temperature sensor 170 may be installed in at least one region of the lower side of the filter housing 130. For example, each of the at least one temperature sensor 170 may be installed on a lower side of the filter housing 130 and/or a side region of a lower side of the filter housing 130. The temperature sensor 170 may be exposed inside the filter housing 130, but is not limited thereto.

Accordingly, the temperature sensor 170 may continuously measure the temperature of the filter housing 130 while the filter housing 130 is oxidation-combusted.

The controller 160 may continuously combust the filter housing 130 until the temperature measured by the temperature sensor 170 falls below a predetermined temperature.

[Oxidation-Combustion Method]

FIG. 2 is a flowchart illustrating a method of oxidation-combusting an ingot grower according to an embodiment. FIG. 3 shows states of a plurality of valves for each period in the apparatus of oxidation-combusting the ingot grower of FIG. 1.

As shown in FIGS. 1 and 3, a single crystal ingot may be grown in the first period T1. To this end, the controller 160 may operate each of the first and second valves 191 and 192 in an ON state and operate each of the third to fifth valves 193 to 195 in an OFF state. Accordingly, an air circulation structure including the chamber 110, the exhaust pipe 120, the filter housing 130, and the main pump 180 may be formed. The ON state may mean that the valve is open, and the OFF state may mean that the valve is closed.

After each of the first and second valves 191 and 192 is operated in the ON state and the third to fifth valves 193 to 195 are operated in the OFF state, the main pump 180 is operated to operate the chamber 110 to form a vacuum state. In such a vacuum state, a single crystal ingot can be grown.

While the single crystal ingot is grown in the first period T1, a dopant such as red phosphorus is vaporized and deposited on the inner surfaces of the chamber 110, the exhaust pipe 120, and the filter housing 130 to form deposits.

Referring to FIG. 2, after the single crystal ingot is grown, the controller 160 may combust the chamber 110 and the exhaust pipe 120 by introducing air into the chamber 110 and the exhaust pipe 120 (S210).

FIGS. 1 and 3, the chamber 110 and the exhaust pipe 120 may be combusted in the second period T2.

To this end, the controller 160 may operate each of the first to fourth valves 191 to 194 in an OFF state and may operate the fifth valve 195 in an ON state. Accordingly, an air circulation structure including the chamber 110, the exhaust pipe 120, and the first vacuum pump 181 may be formed.

Figure 4:
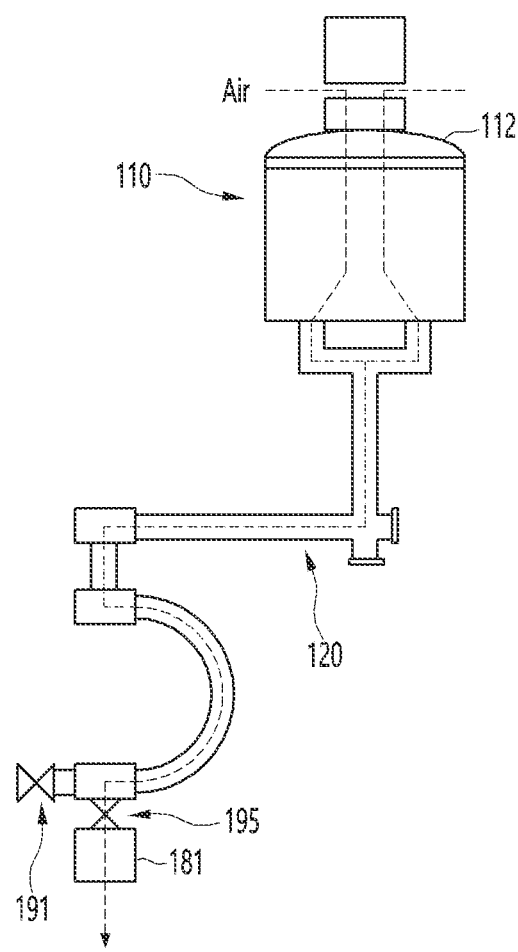
FIG. 4 shows the process of combusting the chamber and exhaust pipe.

Thereafter, as shown in FIG. 4, the controller 160 opens the cover 112 of the chamber 110 so that air in the atmosphere flows into the chamber 110 and operates the first vacuum pump 181. Accordingly, air introduced into the chamber 110 may be discharged to the outside through the exhaust pipe 120 and the first vacuum pump 181. Since the single crystal ingot is grown in a high temperature state in the first period T1, the chamber 110 and the exhaust pipe 120 or the deposits deposited in the chamber 110 and the exhaust pipe 120 may also be maintained at a high temperature. In this way, the high-temperature deposits may be oxidized by air and combustion may proceed.

The second period T2 may be set in consideration of a time when the deposits of the chamber 110 and the exhaust pipe 120 are completely combusted. Accordingly, since both the deposits of the chamber 110 and the exhaust pipe 120 are combusted by the second period T2, the oxidation combustion of the chamber 110 and the exhaust pipe 120 may be completed.

Referring to FIG. 2, the controller 160 may block between the filter housing 130 and the exhaust pipe 120 and form the filter housing 130 in a vacuum state (S220).

Figure 5:
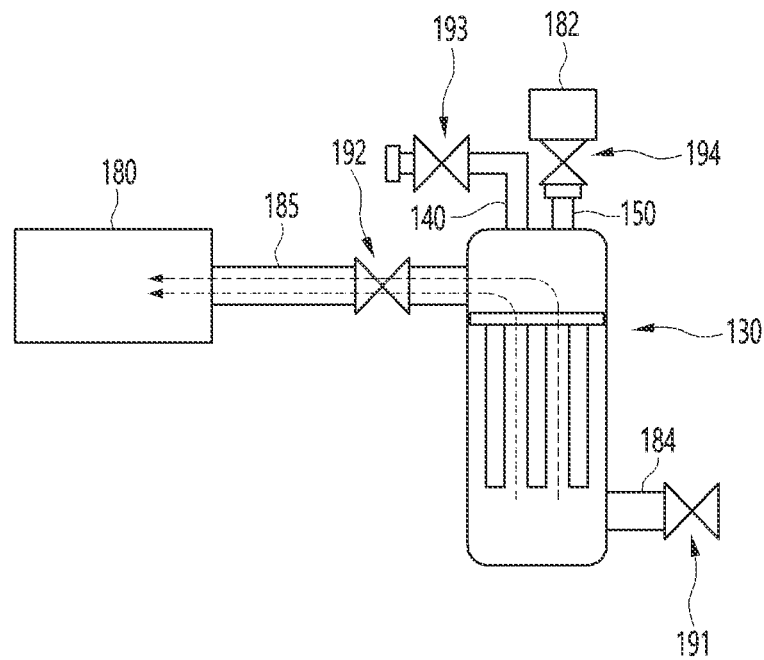
FIG. 5 shows a process of forming the filter housing in a vacuum state.

FIGS. 1 and 3, a vacuum state may be formed in the filter housing 130 in the third period T3. To this end, the controller 160 may operate the second valve 192 in the ON state and operate the first and third to fifth valves 191 and 193 to 195 respectively in the OFF state. Accordingly, the filter housing 130 may be connected only to the main pump 180. Thereafter, as shown in FIG. 5, the controller 160 may operate the main pump 180. Accordingly, air in the filter housing 130 is discharged to the outside so that a vacuum state may be formed in the filter housing 130.

The third period T3 may be set in consideration of a time for reaching a predetermined pressure.

Thereafter, as shown in FIGS. 1 and 3, a vacuum state of the housing may be maintained in the fourth period T4. To this end, the controller 160 may operate each of the first to fifth valves 191 to 195 in an OFF state.

Referring to FIG. 2, the controller 160 may inject air into the filter housing 130 through the injection pipe 140 to combust the filter housing 130 (S230).

As shown FIGS. 1 and 3, the filter housing 130 may be combusted in the fifth period T5. To this end, the controller 160 may operate the third valve 193 in an ON state, and may operate each of the first, second, fourth and fifth valves 191, 192, 194, and 195 in an OFF state. Accordingly, the filter housing 130 may be connected only to the injection pipe 140.

Figure 6:
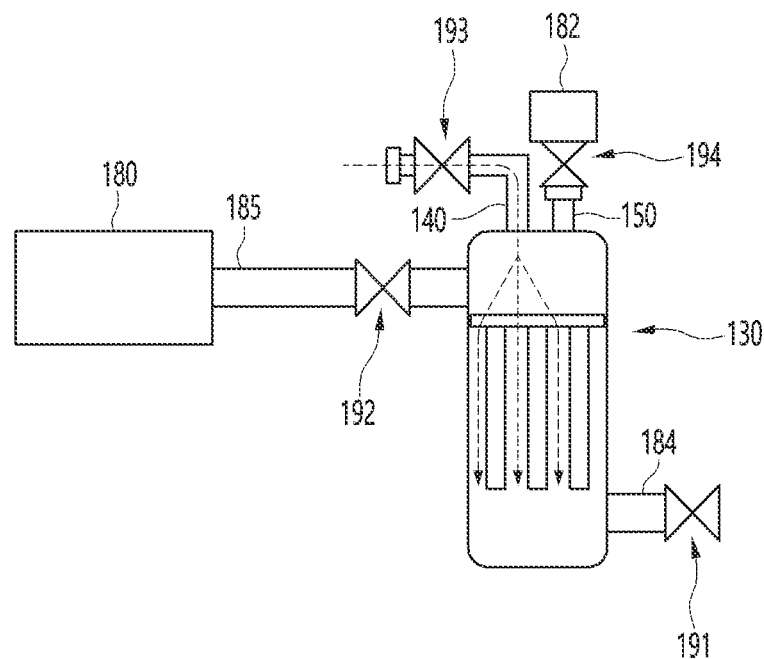
FIG. 6 shows the process of combusting the filter housing.

As shown in FIG. 6, since the third valve 193 is in an ON state, air in the atmosphere may be introduced into the filter housing 130 through the injection pipe 140. Since the third valve 193 is opened while the filter housing 130 is maintained in a vacuum state, air in the atmosphere can be injected into the filter housing 130 at high speed. Accordingly, the deposits deposited on the inner surface of the filter housing 130 may be combusted and removed by an oxidation reaction with air. In particular, since air in the atmosphere is injected at high speed through the injection pipe 140, the air rapidly proceeds from the upper side to the lower side of the filter housing 130 in which the injection pipe 140 is installed, and combustion can proceed from the top to the lower side of the filter housing 130 quickly.

In FIG. 3, although it is shown that the oxidation combustion of the filter housing 130 is performed once by T3 to T5, the oxidation of the filter housing 130 is repeatedly performed with T3 to T5 as one cycle (S240 in FIG. 2). That is, combustion can be carried out multiple times. Accordingly, oxidation combustion of the filter housing 130 may be performed more quickly, and oxidation combustion of the entire area of the filter housing 130 may be possible.

Referring to FIG. 2, the controller 160 may determine whether the temperature of the filter housing 130 is greater than a predetermined temperature (S250) or not.

As shown in FIG. 1, the temperature of the filter housing 130 may be measured by at least one temperature sensor 170 installed in the lower side of the filter housing 130. The controller 160 may check whether the measured temperature is greater than a predetermined temperature or not. The predetermined temperature may be an ignition temperature of deposits deposited on the inner surface of the filter housing 130.

Referring to FIG. 2, when the temperature of the filter housing 130 is greater than a predetermined temperature, the controller 160 forms a circulation structure through which air flows through the injection pipe 140, the filter housing 130, and the discharge pipe 150 (S260).

As shown in FIGS. 1 and 3, when the temperature of the filter housing 130 is greater than a predetermined temperature in the sixth period T6, the temperature of the filter housing 130 may be lowered. To this end, the controller 160 can operate each of the third and fourth valves 193 and 194 in an ON state and operate each of the first, second and fifth valves 191, 192 and 195 in an OFF state. have. Accordingly, the filter housing 130 may be connected to the injection pipe 140 and the discharge pipe 150.

Figure 7:
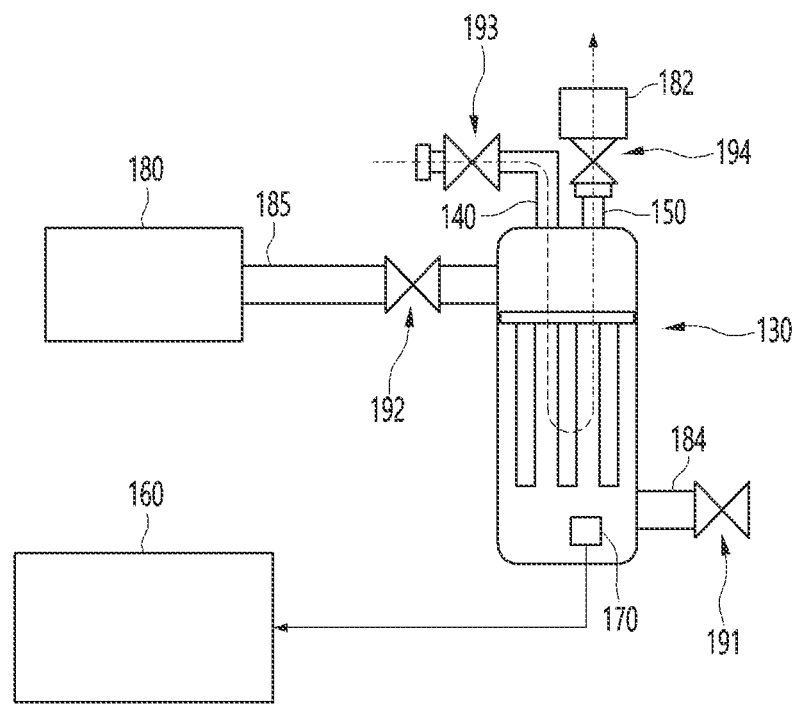
FIG. 7 shows a process of circulating air in the filter housing.

As shown in FIG. 7, since each of the third and fourth valves 193 and 194 is in an ON state, air in the atmosphere is injected into the filter housing 130 through the injection pipe 140, and the filter housing 130, and the air injected into the filter housing 130 may be discharged to the outside through the discharge pipe 150. Accordingly, since air in the atmosphere is continuously injected into the filter housing 130 and then discharged to the outside, the temperature of the filter housing 130 may be lowered.

As the temperature of the filter housing 130 is lowered, the possibility of explosion occurring during the combustion process may be reduced.

Referring to FIG. 2, when the temperature of the filter housing 130 is less than or equal to a predetermined temperature, the controller 160 may terminate the combustion process (S270). When the temperature of the filter housing 130 is less than or equal to a predetermined temperature, it is determined that the combustion of the deposits is not performed in the filter housing 130 and combustion of the deposits are completed so that the combustion process may be terminated.

When the combustion process is terminated in this way, each of the first to fifth valves 191 to 195 may be controlled so that the single crystal ingot can be grown in the first period T1 again.

According to the embodiment, the chamber 110 and the exhaust pipe 120 as well as the filter housing 130 can be quickly oxidation-combusted.

According to the embodiment, the possibility of explosion during combustion in the filter housing 130 may be reduced to prevent a risk due to explosion.

The detailed description above should not be construed as restrictive in all respects and should be considered as illustrative. The scope of the embodiments should be determined by reasonable interpretation of the appended claims, and all changes within the equivalent scope of the embodiments are included in the scope of the embodiments.

What is claimed is:

1. A method of oxidation-combusting an ingot grower comprising a chamber, an exhaust pipe connected to the chamber, and a filter housing connected to the exhaust pipe, the method comprising:
a) blocking flow between the filter housing and the exhaust pipe;
b) forming a vacuum state in the filter housing;
c) injecting air into the filter housing through an injection pipe connected to a first side of the filter housing to combust deposits of the filter housing;
repeating the steps b) and c);
measuring the temperature of the filter housing; and
forming a circulation structure in which the air flows to the injection pipe, the filter housing, and the exhaust pipe connected to a second side of the filter housing when the measured temperature of the filter housing is greater than a predetermined temperature.

2. The method of claim 1, wherein the vacuum state is formed in the filter housing by a main pump connected to a third side of the filter housing.

3. The method of claim 1, wherein the air is introduced into a discharge pipe through the injection pipe and the filter housing by a first vacuum pump installed on a fourth side of the filter housing.

4. The method of claim 1, further comprising:
blocking flow between each of the injection pipe and a discharge pipe and the filter housing and connecting the filter housing to the exhaust pipe when the measured temperature of the filter housing is less than or equal to a predetermined temperature.

5. The method of claim 1, further comprising:
combusting deposits of the chamber and deposits of the exhaust pipe by introducing the air into the chamber and the exhaust pipe.

6. The method of claim 5, wherein the air is introduced into the exhaust pipe via the chamber by a second vacuum pump installed on one side of the exhaust pipe.

7. An apparatus of oxidation-combusting an ingot grower, the apparatus comprises:
a chamber;
an exhaust pipe connected to the chamber;
a filter housing connected to the exhaust pipe;
an injection pipe connected to a first side of the filter housing;
a discharge pipe connected to a second side of the filter housing;
at least one temperature sensor installed at a point far from the injection pipe to measure the temperature of the filter housing; and
a controller, wherein the controller is configured to:
block flow between the filter housing and the exhaust pipe and forming a vacuum state in the filter housing, and inject air into the filter housing through the injection pipe to combust deposits of the filter housing, and
repeatedly perform the process of forming the vacuum state and the process of combusting the deposits of the filter housing.

8. The apparatus of claim 7, further comprises:
a main pump connected to a third side of the filter housing,
wherein the vacuum state is formed in the filter housing by the main pump.

9. The apparatus of claim 7, wherein the controller is configured to form a circulation structure in which the air flows to the injection pipe, the filter housing and the discharge pipe when the measured temperature of the filter housing is greater than a predetermined temperature.

10. The apparatus of claim 9, further comprises:
a first vacuum pump installed on a fourth side of the filter housing,
wherein the air is introduced into the discharge pipe through the injection pipe and the filter housing by the first vacuum pump.

11. The apparatus of claim 9, wherein the controller is configured to block flow between each of the injection pipe and the discharge pipe and the filter housing, and connect the filter housing to the exhaust pipe when the measured temperature of the filter housing is less than or equal to a predetermined temperature.

12. The apparatus of claim 7, wherein the controller is configured to inject the air into the chamber and the exhaust pipe to combust deposits of the chamber and deposits of the exhaust pipe.

13. The apparatus of claim 12, further comprises:
a second vacuum pump installed on one side of the exhaust pipe,
wherein the air is introduced into the exhaust pipe through the chamber by the second vacuum pump.

* * * * *